US010605413B1

(12) United States Patent
Dutta et al.

(10) Patent No.: US 10,605,413 B1
(45) Date of Patent: Mar. 31, 2020

(54) LIGHT EMITTING DIODE FILAMENT LAMP WITH V-GEOMETRY

(71) Applicant: LEDVANCE LLC, Wilmington, MA (US)

(72) Inventors: Arunava Dutta, Winchester, MA (US); Jason Li, Boxford, MA (US)

(73) Assignee: LEDVANCE LLC, Wilmington, MA (US)

( * ) Notice: Subject to any disclaimer, the term of this patent is extended or adjusted under 35 U.S.C. 154(b) by 0 days.

(21) Appl. No.: 16/288,269

(22) Filed: Feb. 28, 2019

(51) Int. Cl.
| F21K 9/23 | (2016.01) |
| F21V 19/04 | (2006.01) |
| F21K 9/232 | (2016.01) |
| H01L 25/075 | (2006.01) |
| H01L 33/62 | (2010.01) |
| F21K 9/20 | (2016.01) |
| F21S 2/00 | (2016.01) |
| F21Y 115/10 | (2016.01) |

(52) U.S. Cl.
CPC ............... *F21K 9/232* (2016.08); *F21K 9/20* (2016.08); *F21K 9/23* (2016.08); *F21S 2/00* (2013.01); *H01L 25/0753* (2013.01); *H01L 33/62* (2013.01); *F21Y 2115/10* (2016.08)

(58) Field of Classification Search
CPC . F21K 9/238; F21K 9/237; F21K 9/90; F21K 9/66; F21K 9/23; F21K 9/00; F21K 9/20; F21K 99/00; F21K 9/232; F21Y 2115/10; F21Y 2107/00; F21Y 2105/12; F21Y 2113/13; F21Y 2103/10; F21V 3/02; F21V 23/005; F21V 29/10; F21V 29/50; F21V 29/503; F21V 29/70; F21V 29/506; F21V 19/042; F21V 19/045; H01L 33/52; H05K 2201/10106; F21S 2/00
See application file for complete search history.

(56) References Cited

U.S. PATENT DOCUMENTS

| 8,400,051 | B2* | 3/2013 | Hakata | H01L 25/0753 |
| | | | | 313/110 |
| 8,858,027 | B2* | 10/2014 | Takeuchi | F21V 23/001 |
| | | | | 362/249.02 |
| 8,922,101 | B2* | 12/2014 | Hakata | H01L 25/0753 |
| | | | | 313/110 |
| 9,261,242 | B2* | 2/2016 | Ge | F21V 3/00 |
| 9,863,624 | B2* | 1/2018 | Rao | F21V 29/503 |
| 10,077,874 | B2* | 9/2018 | Coleiny | F21K 9/232 |
| 10,094,517 | B2* | 10/2018 | Xiang | F21K 9/237 |
| 10,125,926 | B2* | 11/2018 | Ma | F21K 9/237 |
| 10,234,079 | B1* | 3/2019 | Spehalski | F21K 9/235 |
| 10,240,724 | B2* | 3/2019 | Jiang | F21V 9/30 |

(Continued)

*Primary Examiner* — Vibol Tan
(74) *Attorney, Agent, or Firm* — Tutunjian & Bitetto PC

(57) ABSTRACT

A light engine that includes electrical leads extending into a supporting stem and a filament assembly having a V-shaped geometry in electrical connection with the electrical leads. The filament assembly includes at least two light emitting diode (LED) filaments wherein a first end of the filament assembly is in electrical contact with the electrical leads and provides an apex portion of the V-shaped geometry, and a second end of the filament assembly opposite the first end has a second width greater than the first width of the apex portion. An electrically conductive pathway connects the at least two light emitting diode (LED) filaments at the second end of the filament assembly.

13 Claims, 11 Drawing Sheets

(56) References Cited

U.S. PATENT DOCUMENTS

2016/0363267 A1* 12/2016 Jiang .................. F21V 29/70
2018/0080611 A1* 3/2018 Haberkorn ............. F21K 9/238
2018/0328543 A1* 11/2018 Bergmann ............. F21K 9/232
2018/0347802 A1* 12/2018 Fu ........................ F21V 29/73

* cited by examiner

LIGHT EMITTING DIODE FILAMENT LAMP WITH V-GEOMETRY

TECHNICAL FIELD

The present disclosure generally relates to light engines employed in lamp assemblies, and more particularly to light engines employing light emitting diodes for the light source.

BACKGROUND

Conservation and management of electrical power are a growing concern with regard to both cost and environmental impact. In various lighting applications, the use of light emitting diodes (LEDs) for illumination is beginning to emerge as a lighting source with potential for addressing these concerns. LED light sources have a long life, are energy efficient, are durable and operate over a wide temperature range. While LED lighting is becoming an attractive option for certain applications, it is not optimal for many applications. Therefore, there is a need for improved LED lighting systems.

SUMMARY

In one aspect, the methods and structures of the present disclosure improves the light distribution pattern of the light engine of a light emitting diode (LED) lamp by providing a V-geometry for the arrangement of the light emitting diode filaments that provide the light source when compared to prior lamps employing filaments arranged in an inverted V-geometry, sometimes referred to as a Christmas tree geometry due to the inverted V shape of the filament light engine in current state-of-the art LED lamps. The V-geometry for the light engine of the present disclosure includes a base for the assembly of filaments that is connected to the electrical lead lines extending into the supporting stem of the lamp that has a diameter that is less than the portion of the assembly of filaments that extends into the region within the optic for the lamp that is opposite the stem.

In one embodiment, the present disclosure provides a light engine comprising electrical leads extending into a supporting stem. A filament assembly is in electrical connection with the electrical leads and includes at least two light emitting diode (LED) filaments. The filament assembly has a V-shaped geometry, wherein a first end of the filament assembly provides an apex portion of the V-shaped geometry. The first end of the filament assembly is in electrical contact with the electrical leads. A first of the at least two light emitting diode filaments is electrically connected to an anode of the electrical leads, and a second of the at least two light emitting diode filaments is electrically connected to a cathode of the electrical leads. The second end of the filament assembly opposite the first end that is in electric communication with the electrical leads has a second width greater than the first width of the apex portion. An electrically conductive pathway connects the first and second of the at least two light emitting diode filaments at the second end.

In one embodiment, a lamp is provided that includes a housing including a light projecting end and a base having an electrical connector for connection with a lamp fixture; and a light engine including light emitting diodes (LEDs) positioned at the light projecting end of the housing. The light engine includes electrical leads extending into a supporting stem. A filament assembly is in electrical connection with the electrical leads and includes at least two light emitting diode filaments. The filament assembly has a V-shaped geometry, wherein a first end of the filament assembly provides an apex portion of the V-shaped geometry. The first end of the filament assembly is in electrical contact with the electrical leads. The second end of the filament assembly opposite the first end that is in electric communication with the electrical leads has a second width greater than the first width of the apex portion. An electrically conductive pathway connects the first and second of the at least two light emitting diode filaments at the second end. A driver assembly is in electrical communication with an electrical connector of the base of the housing and the electrical leads to the light engine. The driver assembly is present in the housing.

In another aspect of the present disclosure, a method of assembling a lamp is provided that includes connecting a filament assembly to a supporting stem of a lamp. The stem includes a mandrel and electrical leads. The filament assembly includes at least two light emitting diode filaments each including a connecting electrically conductive pathway from a second end from each of the at least two light emitting diode filaments to a slide ring. The mandrel is positioned between an anode and a cathode of the electrical leads. Connecting the filament assembly to the supporting stem includes electrically connecting a first end for a first of the at least two light emitting diode filaments to the anode and electrically connecting a first end for a second of the at least two light emitting diode filaments to the cathode, wherein the mandrel is positioned within an opening of the slide ring. A cap is placed on the mandrel atop the ring. The filament assembly connected to the stem is then inserted into an open end of an optic, and the cap that is present atop the slide ring contacts a dome portion of the optic, wherein as the stem is brought into the seating position with the optic, the cap presses down on the ring sliding the ring downward on the mandrel. Sliding the ring downward pushes the connecting electrically conductive pathways that are electrically connected to the second end of the at least two light emitting diode filaments away from the mandrel. The first end of the at least two light emitting diode filaments is substantially fixed adjacent to the mandrel. A second width of separation at the second end of the at least two light emitting diode filaments is greater than a first width of separation at the first end of the at least two light emitting diode filaments to provide that the at least two light emitting diode filaments are arranged in a V-shaped geometry when the stem is in the seated position with the optic.

BRIEF DESCRIPTION OF THE DRAWINGS

The following description will provide details of embodiments with reference to the following figures wherein.

DETAILED DESCRIPTION

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. As used herein, "direct electrical contact" denotes electrical communication across a physical electrically conductive medium, such as a metal wire. The term "electrical communication" denotes the transmission of power, i.e, power transfer, or electrical current, but does not require direct contact between the elements that are in electrical communication.

In some light emitting diode (LED) filament lamps, the filaments are arranged in such a manner that the effective diameter of the circle formed by the top of the filaments, i.e., portion closest to the upper dome of the optic (also referred to as globe), is smaller than that formed by the bottom of the filaments, i.e., portion closest to the electrode for communication with the lamp fixture. In other words, the filaments are arranged in a conical geometry, looking similar to an inverted V shape, with the diameter of the base of the filament cone being larger than the diameter of the top of the cone.

The structures and methods of the present disclosure provide a light engine including light emitting diode (LED) filaments that are arranged in a geometry that will allow for an improved light distribution pattern that is not possible with the existing inverted V geometry. The light engine of the present disclosure employs light emitting diode (LED) filaments that are arranged in a V shaped geometry, as opposed to an inverted V shape geometry. In some embodiments, the new geometry, i.e., V shaped geometry, for the LED filament layout can be used in conjunction with decorative filament lamps. The methods and structures of the present disclosure are now described with reference to FIGS. 1-11.

Figure 1:
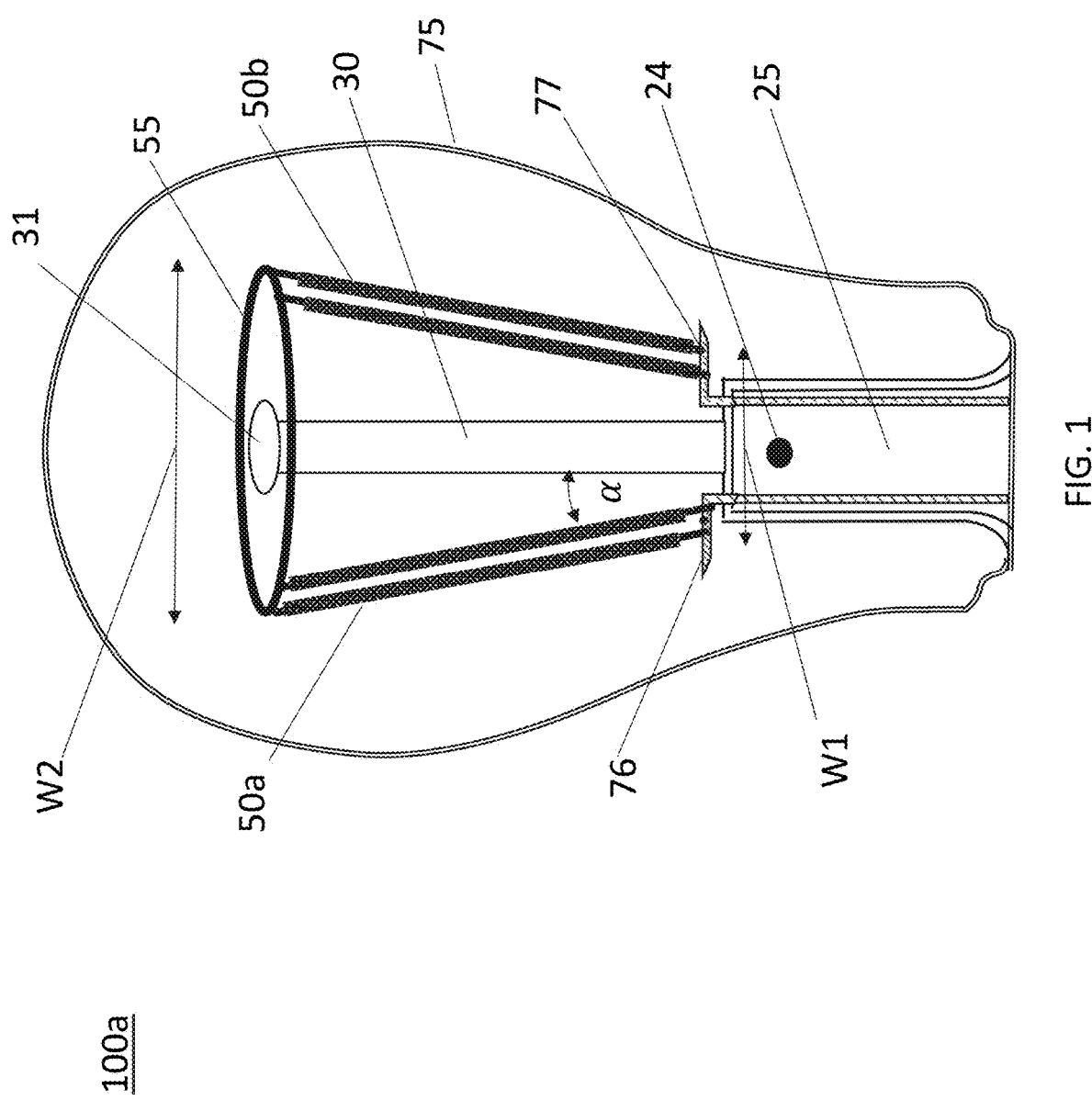
FIG. 1 is a side cross-sectional view of the filament assembly including at least two light emitting diode filaments arranged in a V-shaped geometry within the optic of a lamp, in which the end of the filaments opposite the end connected to the stem are joined by an electrically conductive pathway in the shape of a ring that encircles the mandrel of the stem, in accordance with one embodiment of the present disclosure.

FIGS. 1-7 depict some embodiments of a filament assembly 100a, 100b, 100c, 100d, 100e that includes at least two light emitting diode (LED) filaments 50a, 50b that are arranged in a V shaped geometry within the optic 75 of a lamp, in which the end of the filaments 50a, 50b opposite the end of the filaments 50a, 50b that are connected to the stem 25 are joined by an electrically conductive pathway 55, 55a, 55b, 55c. In the embodiment that is depicted in FIG. 1, the electrically conductive pathway 55 is in the shape of a ring that encircles the mandrel 30 of the stem 25.

A light emitting diode (LED) is a form of solid state light emitter. The term "solid state" refers to light emitted by solid-state electroluminescence, as opposed to incandescent bulbs (which use thermal radiation) or fluorescent tubes, which use a low pressure Hg discharge. In a broad sense, a light emitting diode (LED) is a semiconductor device that emits visible light when an electric current passes through it. Some examples of solid state light emitters that are suitable for the methods and structures described herein include inorganic semiconductor light-emitting diodes (LEDs), surface mount light emitting diodes (SMT LEDs) or combinations thereof.

Figure 2A:
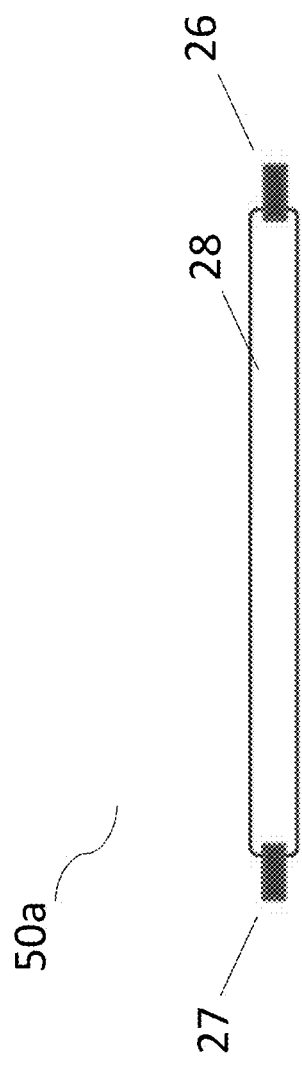
FIGS. 2A-2C are perspective views of a light emitting diode filament in accordance with one embodiment of the present disclosure.
Figure 2B:
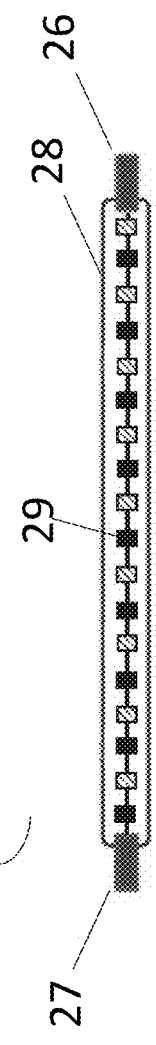
Figure 2C:
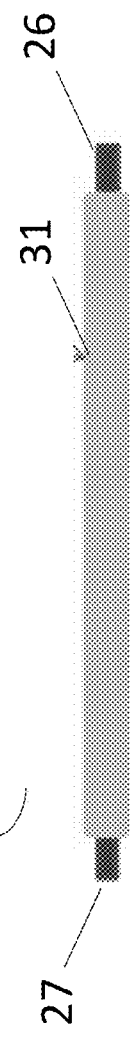

In some embodiments, the light emitting diodes (LEDs) that are employed in the light engine 100a, 100b, 100c, 100d, 100e are light emitting diode (LED) filaments. Referring to FIGS. 2A-2C, the substrate 28 for each of the light emitting diode (LED) filament structures 50a, 50b includes a plurality of series connected light emitting diodes (LEDs) 29 present on the substrate 28 and extending from the cathode contact portion 27 to the anode contact portion 26.

FIG. 2A illustrates one embodiment of the substrate 28 that is positioned between the anode contact portion 26 and the cathode portion 27. In some embodiments, the substrate 28 may be a transparent substrate, which can be made from glass, e.g., silicon (Si) and/or silicon oxide ($SiO_2$), or sapphire, e.g., aluminum oxide ($Al_2O_3$). This transparency allows the emitted light to disperse evenly and uniformly without any interference or light loss. In some other embodiments, the substrate 28 may be a metal strip. It is noted that although FIGS. 2A-2C illustrate a LED filament having reference number 50a, the description of the LED filament depicted in FIGS. 2A-2C is equally applicable to the LED filament that are described herein having reference number 50b. In some embodiments, the substrate 28 that is depicted in FIG. 2A may be referred to as the first layer of the LED filaments 50a, 50b.

Referring to FIG. 2B, in some embodiments, each of the light emitting diode (LED) filament structures 50a includes LED's 29 (also referred to as LED dies) arranged in rows on small strips. The number of LED dies 29 on any one filament may range from 10 upwards. In one example, the number of LEDs 29 arranged on the substrate 28 of the light emitting diode (LED) filaments structures 50a can range from 10 LEDs to 50 LEDs. In another example, the number of LEDs 29 arranged on the substrate 28 may range from 15 LEDs to 40 LEDs. In yet another example, the number of LEDs 29 arranged on the substrate 28 may range from 20 LEDs to 30 LEDs. The LEDs 29 present on the substrate 28 can be electrically connected in series extending from the cathode contact portion 27 to the anode contact portion 26. In the embodiment depicted in FIG. 2B, the LEDs 29 may be interconnected in series using a connective wire by a process commercially known as wire bonding.

In one example, the LEDs 29 are unpackaged LED dies. The LEDs 29 and connective elements to provide for series connection can be referred to as the second layer of the filament LED, which is present atop the substrate 28. The LED die 29 can be made of $In_xGa_yN_z$ where the x, y and z refer to different stoichiometric compositions. The form factor of the dies for the LEDs 29 can be 1128, 0922, 0815, 0714, 0627 or smaller. The first two digits and the last two digits are the dimensions of the die in thousandths of an inch. This list is by no means exhaustive and other form factors are within the scope of the present disclosure.

FIG. 2C illustrates one embodiment of a phosphor coating 31 that is present atop the LEDs 29, which are present on the substrate 28. In one example, the LED's 29 on the filament strip, i.e., substrate 28, emit a blue colored light. For example, the blue light emitted by the LEDs 29 on the filament strip, i.e., substrate 28, of the LED filaments 50a may have wavelengths ranging from approximately 430 nm to 470 nm. To provide "white light" a coating of phosphor 31 in a silicone resin binder material can be placed over the LEDs 29 to convert the blue light generated by the LEDs 29. White light is not a color, but a combination of all colors, hence white light contains all wavelengths from about 400 nm to 700 nm. Different chemistries of phosphor coatings 31 can be used to change the color of the light being emitted by the LEDs 29. A typical phosphor chemistry that is used is yttrium aluminum garnet doped with cerium. This phosphor converts blue light to yellow light. When unconverted blue light from the die combines with yellow light from the phosphor, the brain creates a sensation of white light. In some embodiments, the phosphor coating 31 that is depicted in FIG. 2C may be referred to as the third layer of the filament LED 50a, 50b.

Referring to FIGS. 1-7, the LED filaments 50a, 50b may range in length from 20 mm (¾") and upwards. In one example, each of the light emitting diode (LED) filament structures 50a, 50b may have a length on the order of 100 mm (4") and a width on the order of 3 mm (⅛"). In some examples, filament LED lamps that are suitable for use with the light engines 100a, 100b, 100c, 100d, 100e may include both short filaments, e.g., 20 mm-40 mm, and long filaments, e.g., 40 mm-60 mm.

Referring to FIGS. 1-7, in some embodiments, the white light emitted by the light emitting diode (LED) filament structures 50a, 50b have a color temperature ranging from 2700K to 6500K. In one example, the white light emitted by the LED filaments structures 50a, 50b may be referred to a "day white" with a temperature ranging from 3800K to 4200K. In another example, the white light emitted by the light emitting diode (LED) filament structures 50a, 50b may have a warm white light with a temperature ranging from around 2600K to 3000K. It is noted that the above examples are provided for illustrative purposes only, and are not intended to limit the present disclosure.

In some embodiments, light emitting diode (LED) filaments 50a, 50b are selected for decorative filament lamps. Decorative filament lamps may have light emitting filaments that emit in the red or green or blue (R-G-B) portions of the visible spectrum. The decorative lamps may have colored glass bulbs as shells. The decorative lamps may also have a combination of colored light emitting filaments and colored glass bulbs. A colored light emitting filament has an appropriate phosphor blend deposited on top of the blue emitting semi-conductor dies such that the combination of the blue light from the dies and the light emitted by the phosphor blend results in a substantially red or green or blue emission. In general, blue light is defined in this specification as light that includes wavelengths from 400-500 nm. Red light includes wavelengths from 600-700 nm and green light includes wavelengths from 500-600 nm. Blue and green and red light wavelengths can be emitted by the light emitting diode (LED) filaments described herein.

The filaments 50a, 50b are arranged in the light engine 100a, 100b, 100c, 100d, 100e to have a V shaped geometry, in which the portion of the filaments 50a, 50b closest to the base 65 of the lamp having an electrical connector 66 for connection with a lamp fixture is referred to as the "first" end of the filaments 50a, 50b. The first end of each filament is connected to an electrical lead line 76, 77 that extends from the stem 25 of the light engine 100a, 100b, 100c, 100d, 100e and provides the apex portion of the V shaped geometry for the light engine 100a, 100b, 100c, 100d, 100e. The second end for each filaments 50a, 50b is electrically connected to each other by the electrically conductive pathway 55. The second end for each of the filaments 50a, 50b is opposite the first end for the filaments, wherein the second end of the filaments 50a, 50b is closest to the uppermost portion of the dome of the globe 75 when the light assembly 100a, 100b, 100c, 100d, 100e is installed in a lamp. To provide the V shaped geometry, the width W2 of separation for the opposing light emitting diode filaments at their second end is greater than the width W1 of separation for the opposing light emitting diode filaments 50a, 50b at their first end. In one embodiment, the width W2 of separation for the opposing light emitting diode filaments 50a, 50b at their second end may range from 28 mm to 50 mm, and the width W1 of separation for the opposing light emitting diode filaments 50a, 50b at their first end may range from 4 mm to 14 mm.

In some embodiments, a mandrel 30 is present vertically extending from the stem 25 and is positioned between the opposing light emitting diode (LED) filaments 50a, 50b. In some embodiments, the height of the mandrel 30 is substantially equal to the height of the light emitting diode (LED) filaments 50a, 50b. To provide the V shaped geometry, the width of the separation between the light emitting diode (LED) filaments 50a, 50b on opposing sides of the mandrel 30 may increase from the base at the first end of the light emitting diode (LED) filaments 50a, 50b to the upper surface at the second end of the light emitting diode (LED) filaments 50a, 50b, in which the taper is defined by a taper angle α at the first end of the light emitting diode (LED) filaments 50a, 50b measured between one of the light emitting diode (LED) filaments 50a, 50b and the mandrel 30. In some embodiments, the taper angle α may range from 2° to 45° from the mandrel 30, as depicted in FIGS. 1 and 3-7. In another embodiment, the angle α of taper can be 5° to 30° from the mandrel 30. In some examples, the angle α of taper can be 5°, 10°, 15°, 20°, 25°, 30°, 35°, 40°, as well as any range of angles including one of the aforementioned values for the lower end of the range, and one of the aforementioned values for the upper end of the range.

The angle α of taper is measured from the first end of the light emitting diode (LED) filaments 50*a*, 50*b* that is connected to the electrical lead lines 76, 77 that extend from the stem 25. The glass stem 25 houses electrical lead wires 76, 77 that bring in DC (direct current) from the driver (not shown) to the LED filaments 50*a*,50*b*. FIGS. 1 and 3-5 depict four filaments 50*a*, 50*b* that are connected as two filaments in parallel and two filaments in series (2P2S) configuration.

For example, the at least two light emitting diode (LED) filaments 50*a*, 50*b* of the light engine 100*a*, 100*b*, 100*c*, 100*d* may include a first set of light emitting diode (LED) filaments 50*a* connected in parallel to the anode of the electrical leads 76 on a first side of a mandrel 30 extending from the stem 25 at the first end of the filament assembly, and a second set of light emitting diode (LED) filaments 50*b* connected in parallel to the cathode of the electrical leads 77 on a second side of the mandrel 30 extending from the stem 25 at the first end of the filament assembly 100*a*, 100*b*, 100*c*, 100*d*. The first and second set of light emitting diode (LED) filaments 50*a*, 50*b* connected in series at the second end of the filament assembly 100*a*, 100*b*, 100*c*, 100*d* by the electrically conductive pathway 55, 55*a*, 55*b*, 55*c*.

Although FIGS. 1 and 3-5 depicts a light engine (LED) 100*a*, 100*b*, 100*c* 100*d* having four light emitting diode (LED) filaments 50*a*, 50*b*, the present disclosure is not limited to only this number. There could also be two filaments as well as six filaments etc.

Figure 3:
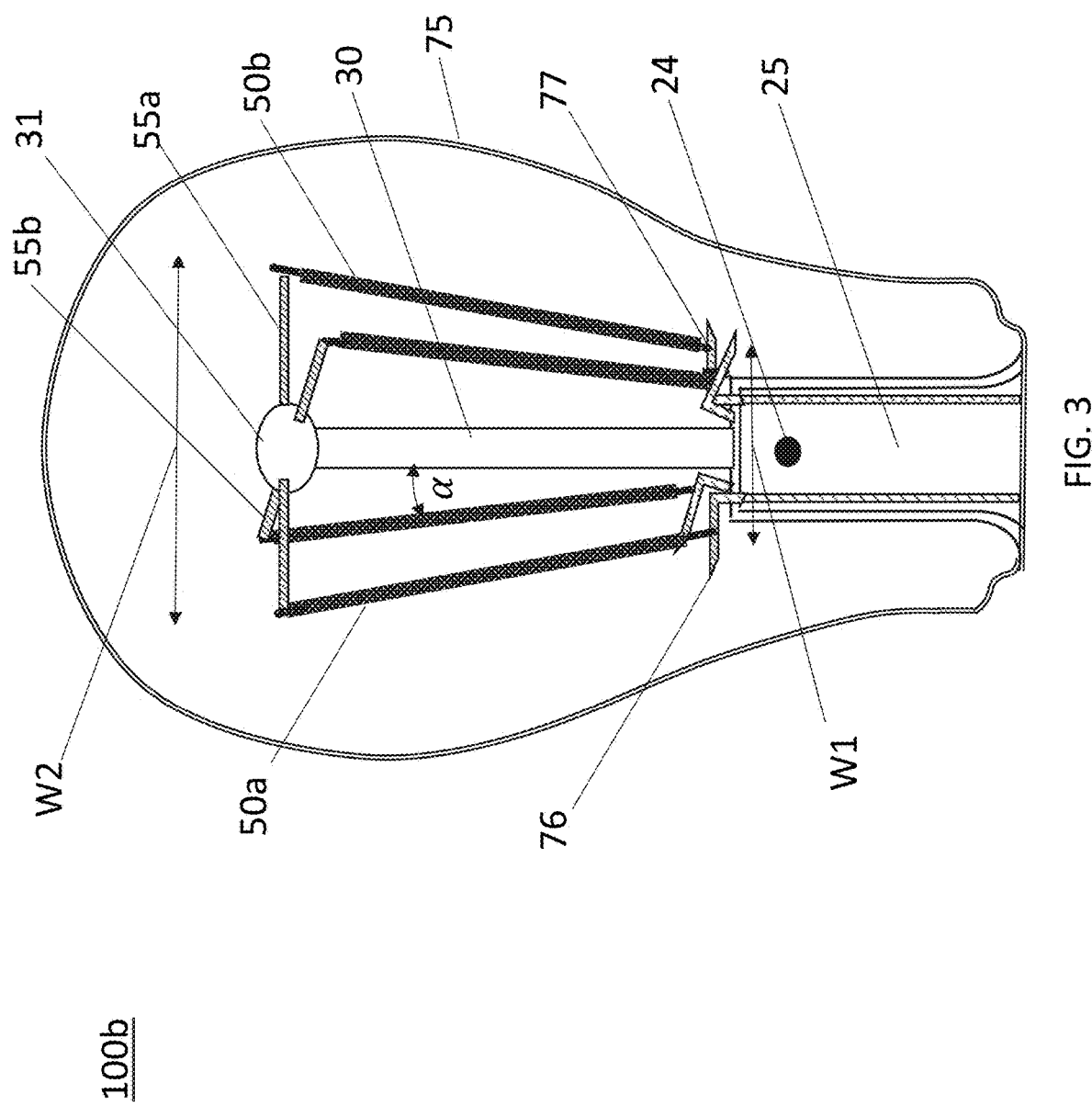
FIG. 3 is a side cross-sectional view of another embodiment of a filament assembly including at least two light emitting diode filaments arranged in a V-shaped geometry within the optic of a lamp, in which the end of the filaments opposite the end connected to the stem are joined by an electrically conductive pathway that passes through the mandrel of the stem.
Figure 4:
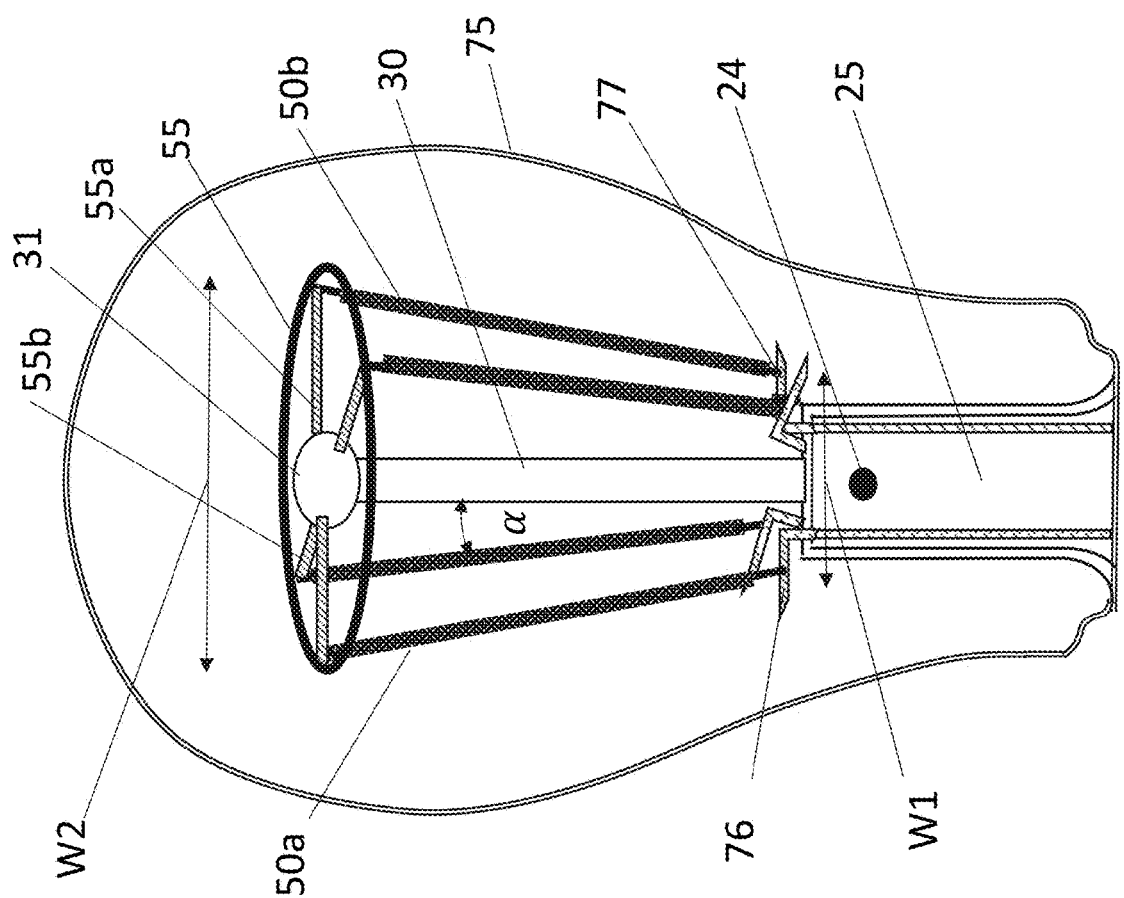
FIGS. 4 and 5 are side cross-sectional view of yet another embodiment of a filament assembly including at least two light emitting diode filaments arranged in a V-shaped geometry within the optic of a lamp, in which the end of the filaments opposite the end connected to the stem are joined by an electrically conductive pathway in the shape of a ring that encircles the mandrel of the stem, and further mechanical support is provided by metal wires that pass through the mandrel of the stem to connect opposing filaments.

The opposing filaments 50*a*, 50*b* are electrically connected at the second end of the filaments, i.e., top of the filaments, by an electrically conductive pathway 55, 55*a*, 55*b*, 55*c*, which in some embodiments can be provided by connecting wires. In some embodiments, the electrically conductive pathway 55 has the geometry of a ring, which may be attached to the second elements of the light emitting diode (LED) filaments by any suitable joining method, which may include spot welding, as depicted in FIGS. 1 and 4. The ring that provides the electrically conductive pathway 55 that is depicted in FIG. 1 may be composed of any suitable electrically conductive material like nickel plated steel, aluminum, copper etc. FIG. 3 depicts another embodiment of a filament assembly 100*b* including at least two light emitting diode (LED) filaments 50*a*, 50*b* arranged in a V-shaped geometry within the optic 75 of a lamp, in which the end of the filaments 50*a*, 50*b* at the first end connected to the stem 25. In the embodiment that is depicted in FIG. 3, there are two sets of light emitting diode (LED) filaments 50*a*, 50*b*. The two sets of light emitting diode (LED) filaments 50*a*, 50*b* are electrically connected by an electrically conductive pathway 55*a*, 55*b*, in which each linear wire extends from one light emitting diode (LED) filament across the mandrel 30 to an opposing light emitting diode (LED) filament connecting the two at their second end.

In some embodiments, the light engines 100*a*, 100*b*, that are depicted in FIGS. 1 and 3 have a taper angle α of 15° or less. The taper angle α provides that the separation of the light emitting diode (LED) filaments at the upper surface of the light engine 100*a*, 100*b* is greater than the separation of the light emitting diode (LED) filaments at the base of the light engine 100*a*, 100*b*, in which the base of the light engine 100*a*, 100*b* provides the apex portion of the V shaped geometry for the light engine 100*a*, 100*b*. The V shaped geometry for the light emitting diode (LED) filaments (LEDs) provides an enhanced light distribution pattern that is not possible with light engines having light emitting diode (LED) filaments arranged in an inverted V shaped geometry. For example, the new more uniform light distribution pattern provided by the light engine having the light emitting diode (LED) filaments arranged in a V shaped geometry can be especially advantageous when employed in a lamp to emit decorative light, e.g., red or blue or green light or any combination thereof.

Figure 5:
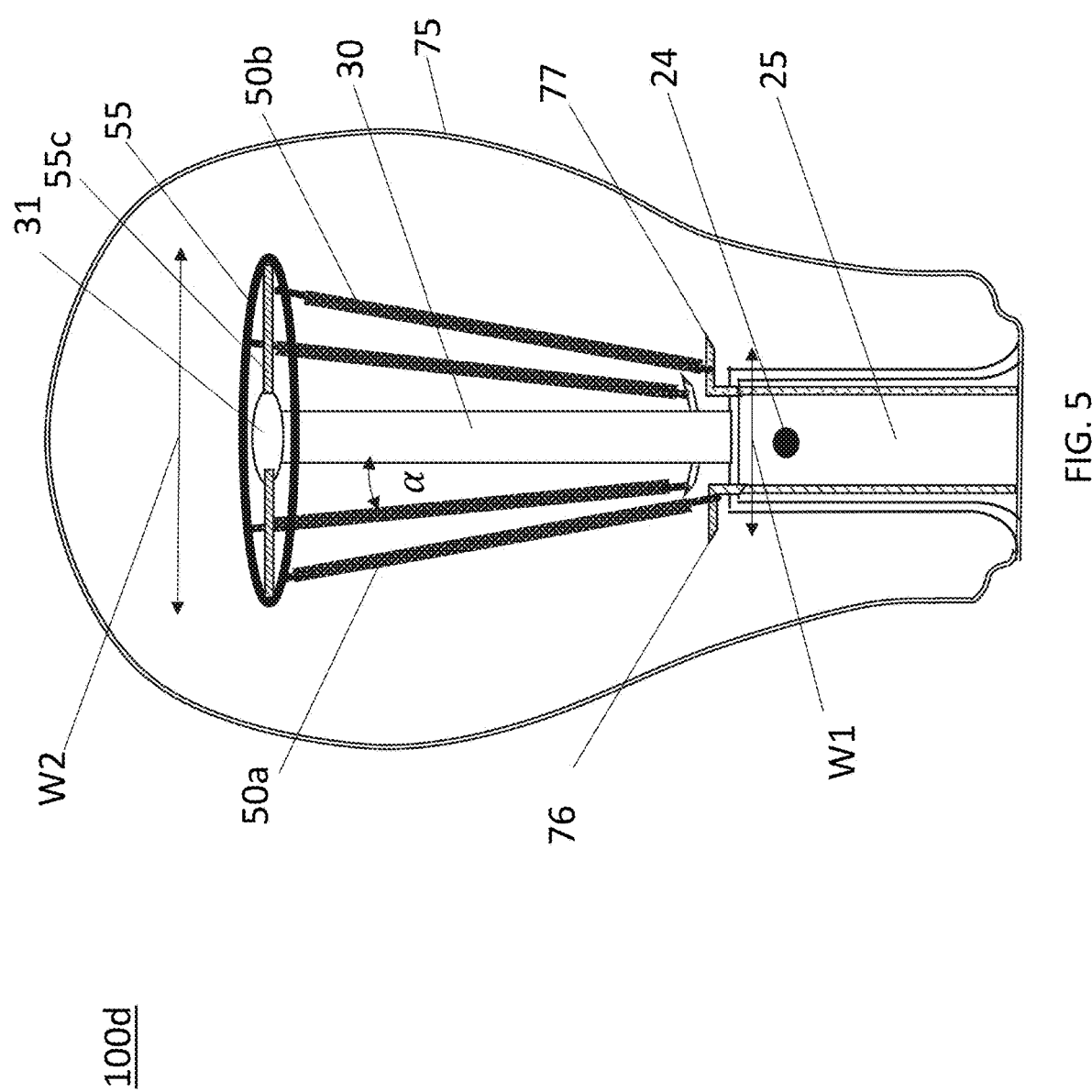

FIGS. 4 and 5 depict yet another embodiment of a filament assembly including at least two light emitting diode (LED) filaments arranged in a V-shaped geometry within the optic of a lamp, in which the end of the filaments opposite the end connected to the stem are joined by an electrically conductive pathway 55 in the shape of a ring that encircles the mandrel of the stem, and further mechanical support is provided by metal wires 55*a*, 55*b* that pass through the mandrel of the stem to connect opposing filaments. In some embodiments, the metal wires 55*a*, 55*b* contacts portions of the ring.

Figure 9:
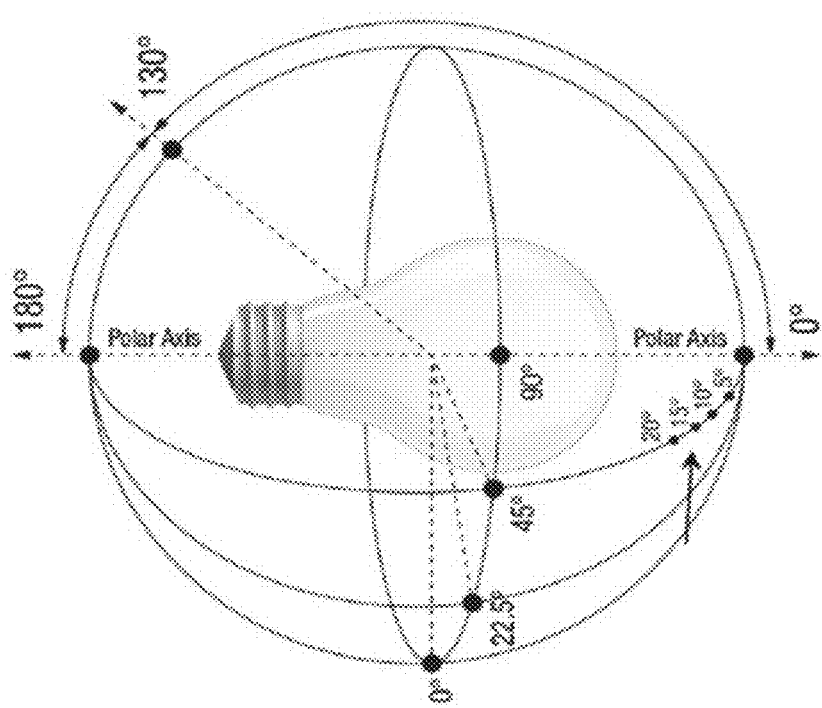
FIG. 9 is an illustration depicting the angles of a lamp that are defined for measuring illumination by goniometry.

The V-shaped geometry for the light engine 100*a*, 100*b*, 100*c*, 100*d* that are depicted in FIGS. 1 and 3-5 provides for a more uniform light distribution when compared to light engines incorporating an inverted V geometry. However, in some embodiments as depicted in FIG. 4, when the V shaped light engine 100*a*, 100*b*, 100*c*, 100*d* of the present disclosure can be even more enhanced, by providing a bigger taper angle α of the V geometry relative to the vertical, i.e, the height of the mandrel 30, so we have an even larger diameter W2 at the top of the V geometry, it is possible to direct more light to the lower region of the lamp. By lower region of the lamp is meant the angular region from around 135° to 180° or from around −135° to 180°, as depicted in FIG. 9. By increasing the light in the lower region of the lamp, the light engine can provide more light to the floor. This would create a desirable enhanced disco effect for dance floors in bars, and restaurants etc., especially when the lamp is coupled with a pulsed electronic driver. In some embodiments, a lamp employed for disco type applications includes flashing.

FIG. 4 illustrates one embodiment of a light engine 100*c* with light emitting diode (LED) filaments 50*a*, 50*b* having an enhanced V shaped geometry, in which the taper angle α is selected to provide a wider upper dimension for the separation of the filaments 50*a*, 50*b*, i.e., at the upper surface of the light engine, wherein the wider V geometry provide increased lower lighting of the lamp. An enhanced V shaped geometry that provides increased lower lighting has a taper angle α (also referred to as tilt angle) that exceeds 15° and may be as great as 30°. With the enhanced V shaped configuration shown in FIG. 4, increased lumen can be measured in the −130/180/+135 deg zone, which is light directed towards the floor. Lighting having these characteristics are especially suitable for floor lighting, e.g., dance floor lighting. Measurements from a light engine having the geometry and taper angle α, e.g., a taper angle α exceeding 15° and being less than 30°, also shows increased lumens towards the top of the lamp in the −30/0/+30 zone. The increased lumens towards the top of the lamp can provide the advantage of minimizing dark zones of the lamp.

Referring to FIGS. 1 and 3-7, in some embodiments, the light engines 100*a*, 100*b*, 100*c*, 100*d*, 100*e* that are described herein include a mandrel 30, which may be provided by a glass rod, that is centrally positioned in the light engine 100*a*, 100*b*, 100*c*, 100*d*, 100*e*, and embedded in the glass stem 25. In some embodiments, there is a button 31 atop the top surface of the mandrel 30. Similar to the mandrel 30, the button 31 may also be composed of glass. In the embodiment that is depicted in FIG. 1, there is no physical connection between ring that provides the electrically conductive pathway 55 and the mandrel 30, but the provision is there for this connection. This connection may be desired, if for example, added mechanical stability is needed for ring, as depicted in FIGS. 4 and 5. In the embodiments depicted in FIGS. 4 and 5, there are electrically conductive wires 55a, 55b, 55c connecting opposite ends of the ring. Wires may pass through the glass button 31 that is located at the top of glass mandrel 30 that is embedded in stem 25. In the embodiment that is depicted in FIG. 3, the ring may be omitted, wherein the electrically conductive pathway 55a, 55b for the light engine 100b is provided by connecting wires passing through the glass button 31 at the top of the mandrel 30 into electrical contact with the second end of opposing light emitting diode (LED) filaments 50a, 50b.

Referring to FIGS. 1 and 3-7, the glass stem 25 is sealed to the glass bulb, i.e., optic 75, which is evacuated of air via exhaust port 24 and then backfilled with a gas blend of suitably high thermal conductivity. The glass stem 25 that holds the support rod, i.e., mandrel 30, and in turn the light engine is sealed to the glass bulb (also referred to as optic 75). The glass bulb 75 could belong to any of a number of types of lamp shapes like A19. A21. G, BR, B, C etc. The air from the sealed bulb (optic 75) is evacuated via the exhaust hole 24 located in stem 25. The sealed and exhausted bulb (optic 75) can be backfilled with a suitable gas blend of high thermal conductivity through port 24 and then the tube leading to port 24 (not shown) is tipped off thereby creating a sealed glass bulb (optic 75) containing a suitable gas blend and the light engine.

In some embodiments, the stem 25 is composed of glass, and includes two right angle shaped electrical lead wires 76, 77. These lead wires 76, 77 may be composed of nickel (Ni) plated steel or an alternate suitable material. For example, the lead wires 76, 77 may also be a composite wire including an internal lead wire, a Dumet wire (copper-clad nickel steel wire) and an external lead wire joined in this order.

Figure 10:
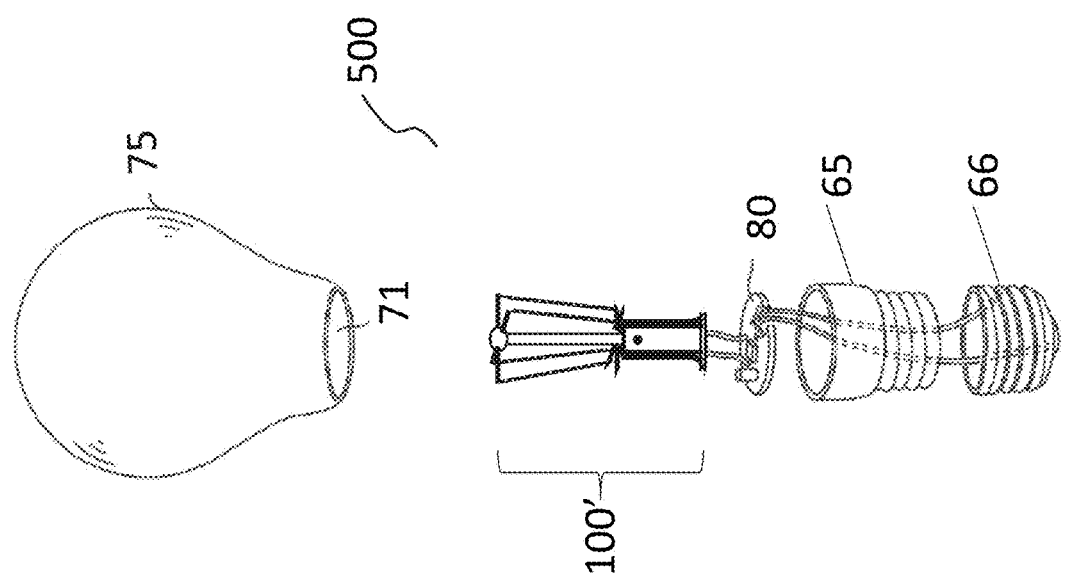
FIG. 10 is an exploded view of a lamp including a filament assembly having at least two light emitting diode filaments arranged in a V shaped geometry, in accordance with one embodiment of the present disclosure.
Figure 11:
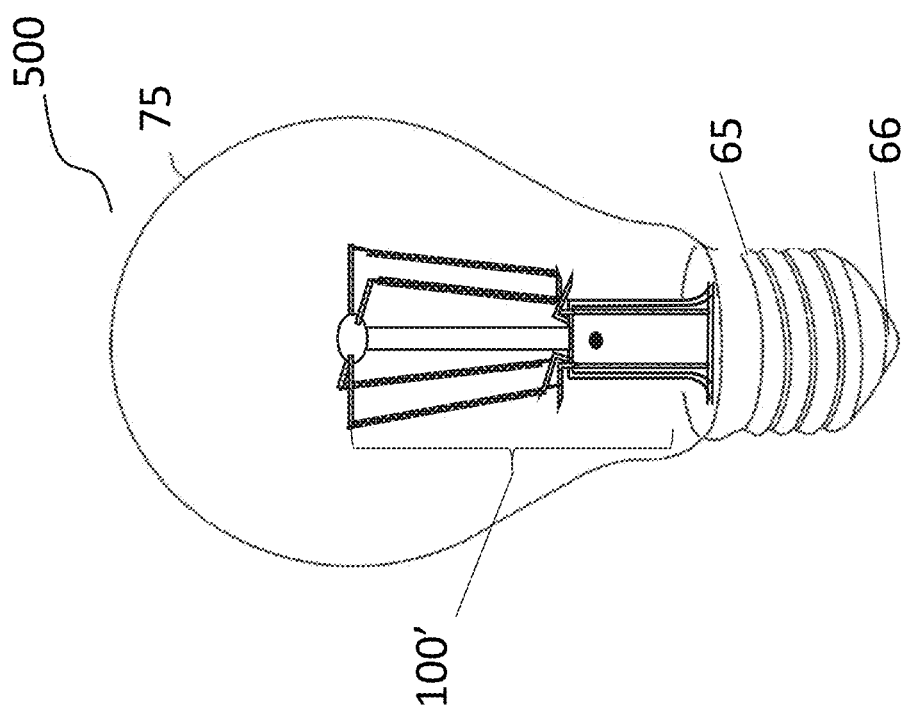
FIG. 11 is a perspective view of a lamp including a filament assembly having at least two light emitting diode filaments arranged in a V shaped geometry, in accordance with one embodiment of the present disclosure.

In another aspect, the light engine 100a, 100b, 100c, 100d, 100e that has been described with reference to FIGS. 1, 3-7, is incorporated into a lamp 500, as depicted in FIGS. 10-11. FIGS. 10-11 illustrate one embodiment of lamp 500 that may include a housing including a light projecting end (present at the optic 75) and a base 65 having an electrical connector 66 for connection with a lamp fixture; and a light engine 100' having at least two light emitting diode (LED) filaments 50a, 50b arranged in a V shaped geometry positioned within the housing to project light through the light projecting end. The light engine 100' that is depicted in FIGS. 10 and 11 may be any of the light engines 100a, 100b, 100c, 100d, 100e that has been described herein with reference to FIGS. 1, 3-7. That description is incorporated herein for describing the light engine 100' of the lamp 500 that is described with reference to FIGS. 10 and 11.

As illustrated in FIGS. 10 and 11, the light bulb shaped lamp 500 is a light bulb shaped LED lamp that can function for replacing an incandescent electric bulb, in which a base 65 is attached to a translucent globe 75. The light engine 100' including the light emitting diode (LED) filament structures 50a, 50b is housed in the globe 75. The light engine 100' including the light emitting diode (LED) filament structures 50a, 50b that are arranged in V shaped geometry is directly fixed to the stem 25 extending through an opening 71 of the globe 75 toward the inside of the globe 75. The stem 25 is in electrical communication with driver electronics, e.g., lighting circuit 80, in which the driver electronics are in electrical communication with the portion of the base 65 that engages the lamp fixture.

In some embodiments, the globe 75 is a hollow translucent component, houses the light engine 100' inside, and transmits the light from the light engine 100' to outside of the lamp 500. In some embodiments, the globe 75 is a hollow glass bulb made of silica glass transparent to visible light. The globe 75 can have a shape with one end closed in a spherical shape, and the other end having an opening 71. In some embodiments, the shape of the globe 75 is that a part of hollow sphere is narrowed down while extending away from the center of the sphere, and the opening 71 is formed at a part away from the center of the sphere. In the embodiment that is depicted in FIGS. 10 and 11, the shape of the globe 75 is Type A (JIS C7710) which is the same as a common incandescent light bulb. It is noted that this geometry is provided for illustrative purposes only, and is not intended to limit the present disclosure. For example, the shape of the globe 75 may also be Type G, Type BR, or others. The portion of the globe 75 opposite the opening 71 may be referred to as the "dome portion of the optic".

The light engine 100' is positioned within the globe 75 by connection to the lead wires 76 and 77 that are supported by the stem 25. The stem 25 is a pillar extended toward the inside of the globe 75. In some embodiments, the stem structure 25 is positioned between the light engine 100' and the driver electronics 80. In some embodiments, the other end portion of the body of the stem 25 opposite the portion from which the leads 76, 77 extend to the light engine 100' includes a flared shape that can be coinciding with the shape of the opening 71. The portion of the body of the stem 25 formed in the flared shape can be joined with the opening 71 of the globe 75 so as to close the opening of the globe 75. In other embodiments, the flared shape of the stem 25 may engage a first surface of the base housing 65 and the globe 75 and may also contact a second separate surface of the base housing 65, wherein between the base housing 65, the globe 75 and the flared end portion of the stem 25, a sealed structure is provided. In addition, parts of two lead wires 76 and 77 can be partially sealed in the stem 25. Accordingly, it is possible to supply power to the light engine 100' in the globe 75 from outside of the globe 75 keeping the globe 75 airtight. Accordingly, the light bulb shaped lamp 500 can prevent water or water vapor from entering the globe 75 for a long period of time, and it is possible to suppress the degradation of the light engine 100' and a part connecting the light engine and the lead wire 76, 77 due to moisture.

The lamp 500 may further include a light stem 25 including positive and negative leads, i.e., lead wires 76, 77 connected to the first end of the light emitting diode (LED) filaments of the light engine 100'. The stem 25 can be made of soft glass transparent to visible light. This structure of the light bulb shaped lamp 500 suppresses loss of light from the light engine 100' by the stem 25. In addition, the light bulb shaped lamp 500 can prevent the shadow cast by the stem 25. Furthermore, light emitted by the light engine 100' can light up the stem 25. In addition to providing electric current to the LED filaments 50a, 50b of the light engine 100', the two lead wires 76, 77 support the light engine 100' and hold the light engine 100' at a constant position in the globe 75.

Referring to FIGS. 10 and 11, in one embodiment, the driver electronics 80, e.g., lighting circuit, is a circuit for causing the LEDs of the plurality of light emitting diode (LED) filament structures 50a, 50b to emit light, and is housed in the base housing 65. More specifically, the driver electronics 80, e.g., lighting circuit, includes a plurality of circuit elements, and a circuit board on which each of the circuit elements is mounted. In this embodiment, the driver electronics 80, e.g., lighting circuit, converts the AC power received from the base 66 of the base housing 65 to the DC power, and supplies the DC power to the LEDs of the plurality of light emitting diode (LED) filament structures 50a, 50b, through the two lead wires 76, 77. In one embodiment, the driver electronics 80 is a lighting circuit that may include a diode bridge for rectification, a capacitor for smoothing, and a resistor for adjusting current. The lighting circuit is not limited to a smoothing circuit, but may be an appropriate combination of light-adjusting circuit, voltage booster, and others.

The driver electronics 80 may be housed within a base housing 65 that is composed of a resin material. The base housing 65 can be provided at the opening 71 of the globe 75. More specifically, the base housing 65 is attached to the globe 75 using an adhesive such as cement to cover the opening 71 of the globe 75. The base 66 is connected to the end of the base housing 65 that is opposite the end of the base housing 65 that is closest to the globe 75. In the embodiment that is depicted in FIGS. 10 and 11, the base 66 is an E26 base. The light bulb shaped lamp 500 can be attached to a socket for E26 base connected to the commercial AC power source for use. Note that, the base 66 does not have to be an E26 base, and maybe a base of other size, such as E17. In addition, the base 66 does not have to be a screw base, and may be a base in a different shape such as a plug-in base.

It is also within the scope of this invention to couple this new geometry of light engine 100' to an electronic driver 80 that supplies electrical power to the light emitting diode (LED) filaments 50a, 50b in a pulsing manner. More specifically, one could use an electronic driver 80 located in the E26/E27 base, e.g., base housing 65, of the lamp 500 that supplies DC (direct current) to the LED filaments 50a, 50b in pulses so that the lamp flashes creating an entertainment effect useful for club lighting like in discos etc. The electronic driver 80 is designed such that the light engine 100' flashes at a frequency of about 1 Hz to 3 Hz. In other words, under this mode of operation, the lamp would flash about once a second to about three times a second.

Figure 6:
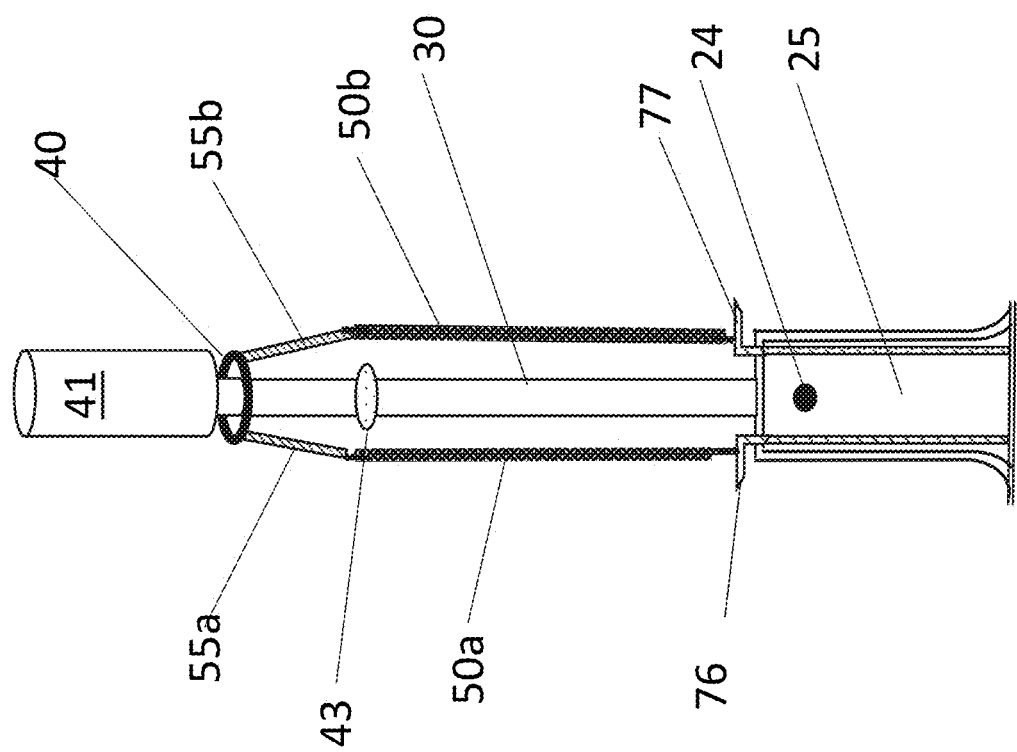
FIG. 6 is a side perspective view of a filament assembly including at least two light emitting diode filaments for the light engine for a lamp, in which the filament assembly is in a geometry having an overall width for insertion through the opening of the lamp optic during lamp assembly.
Figure 7:
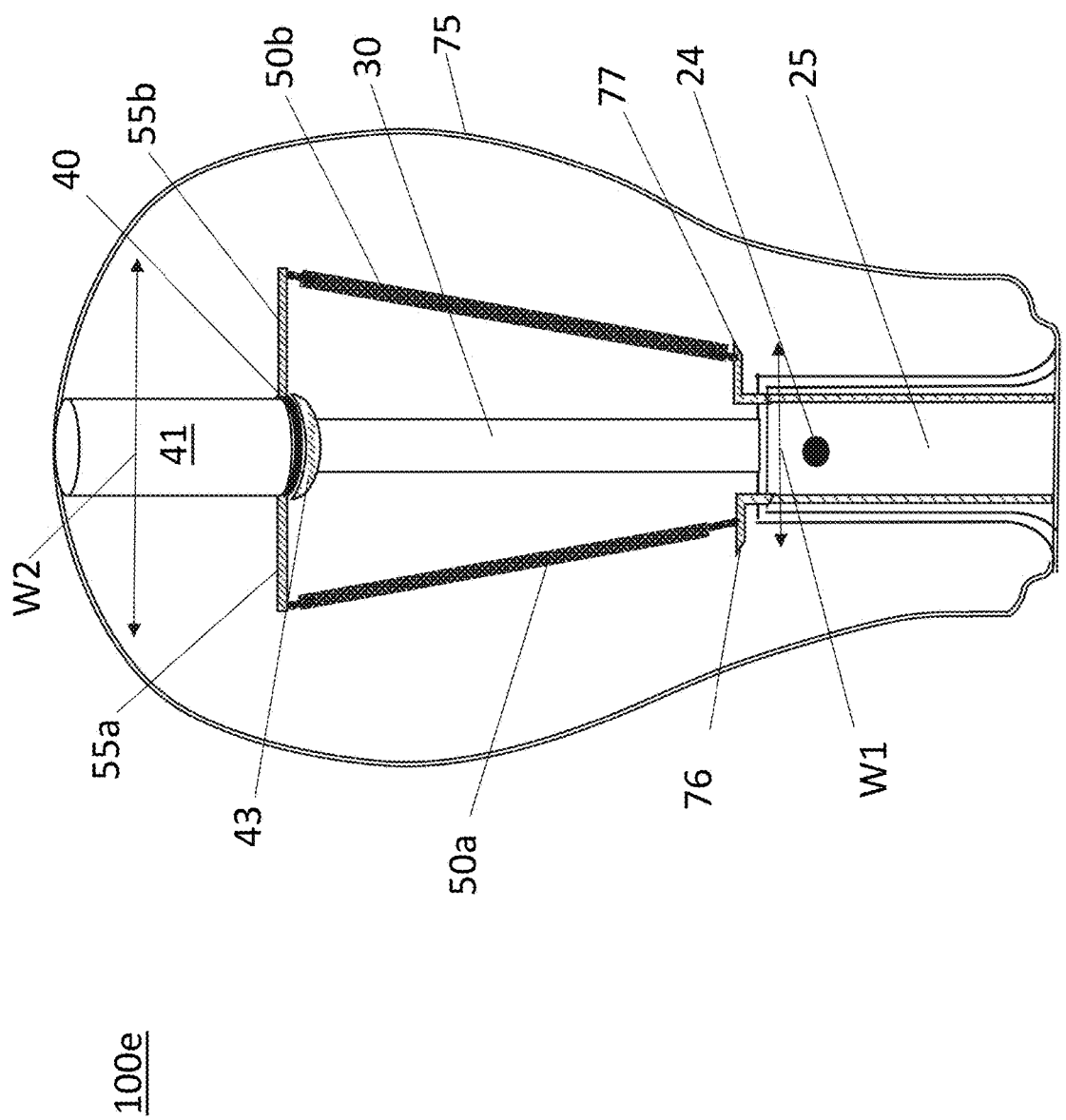
FIG. 7 is a side cross-sectional view of the optic for the lamp, in which the filament assembly is installed within the optic to provide that the filament assembly includes at least two light emitting diode filaments arranged in a V-shaped geometry, in accordance with one embodiment of the present disclosure.

FIGS. 6 and 7 depict some methods for assembling the V shaped light engines 100e into lamp structures. The light engine 100e that includes at least two light emitting diode filaments 50a, 50b arranged in a V shaped geometry may be any of the light engines 100a, 100b, 100c, 100d that has been described herein with reference to FIGS. 1-5. That description is incorporated herein for describing the light engine 100e in the method of assembling lamp structures that is described with reference to FIGS. 6 and 7. FIG. 6 is the light engine 100e before assembly inside the glass bulb, i.e., optic 75, of the lamp 500. FIG. 7 is the light engine 100e after assembly inside the glass bulb, i.e., optic 75.

In one embodiment, the method of assembling the lamp 500 includes connecting a filament assembly for a light engine 100e to a supporting stem 25 of a lamp 500, in which the stem 25 includes a mandrel 30 and electrical leads 76, 77 extending from the stem 25 on opposing sides of the mandrel 30, as depicted in FIG. 6. In one embodiment, the filament assembly 100e that is depicted in FIG. 6 includes at least two light emitting diode (LED) filaments 50a, 50b each including a connecting electrically conductive pathways 55a, 55b from a second end from each of the at least two light emitting diode (LED) filaments 50a, 50b to a slide ring 40. In some embodiments, connecting the filament assembly 100e to the supporting stem 25 includes electrically connecting a first end for the at least two light emitting diode (LED) filaments 50a, 50b to the electrical leads 76, 77 of the stem 25, wherein the mandrel 30 is positioned within an opening of the slide ring 40.

In the embodiment depicted in FIG. 6, the number of light emitting diode (LED) filaments 50a, 50b is equal to four. In some embodiments, a first set of the at least two light emitting diode filaments 50a is electrically connected to an anode of the electrical leads 76, and a second set of the at least two light emitting diode filaments 50b is electrically connected to a cathode of the electrical leads 77. In the embodiment that is depicted in FIG. 6, the at least two light emitting diode filaments include a first set of light emitting diode filaments 50a connected in parallel to the anode of the electrical leads 76 on a first side of a mandrel 30 extending from the stem 25 at the first end of the filament assembly 100e, and a second set of light emitting diode filaments 50b connected in parallel to the cathode of the electrical leads 77 on a second side of the mandrel 30 extending from the stem at the first end of the filament assembly 100e, the first and second set of light emitting diode (LED) filaments 50a, 50b connected in series at the second end of the filament assembly by the electrically conductive pathway 55a, 55b.

The mandrel 30 is placed within the opening in the slide ring 40 to ensure that the slide ring 40 can slide in a direction from the top of the mandrel 30 to the base of the mandrel 30. The slide ring 40 is composed of an electrically conductive material, such as a metal, e.g., steel, aluminum and/or stainless steel. The slide ring 40 is in direct contact with the electrically conductive pathways 55a, 55b. The electrically conductive pathways 55a, 55b may be composed of a wire like geometry structure, and may be composed of an electrically conductive material, such as steel, aluminum and/or stainless steel. In the embodiments in which the electrically conductive pathways 55a, 55b have a wire like geometry, the electrically conductive pathways 55a, 55b may also be referred to as electrical lead wires.

The slide ring 40, which is in contact with the light emitting diode (LED) filaments through the electrically conductive pathways 55a, 55b is positioned on the mandrel 30 to bring the light emitting diode filaments 50a, 50b substantially adjacent to the sidewall of the mandrel 30, in which positioning the length of the light emitting diode filaments 50a, 50b adjacent to the mandrel 30 provides a width for the light engine 100e that allows for the light engine 100e to be passed through the opening 71 of the optic 75. The width of the light engine 100e for the structure depicted in FIG. 6 is intended to be less than the width of the opening 71 to the optic 75 to allow for the structure depicted in FIG. 6 to be inserted into the optic 75. For example, before assembly, the filaments 50a, 50b are slightly tilted outward with 1-5° tilt angle, i.e., taper angle α, between the center rod, i.e., mandrel 30, and the light emitting diode filaments 50a, 50b. However, the max spread (or radius diameter) of the filament assembly is less than the neck diameter of the globe 75 (also referred to as bulb), so the light engine can be inserted into the bulb during assembly.

FIG. 6 further depicts positioning a cap 41 on the mandrel 30 atop the slide ring 40. The cap 41 has an upper surface to contact the dome of the globe 75, and the length of the cap 41 is selected to contact the dome of the globe 75 and apply a force upon the slide ring 40 to push, e.g., slide, the ring downward on the mandrel 30 as the lighting engine 100' and the stem 25 are brought into seating engagement with the base of the globe 75.

The cap 41 may be a hollow tube that is capped at its upper face. The diameter of the hollow portion of the tube for the cap 41 is selected to slide over the mandrel 30 to provide for sliding engagement of the cap 41 relative to the mandrel 30. Slide ring 40 is contacted by the sidewalls of the base end of the cap 41, i.e., the end having the opening to the hollow that is opposite the capped end of the cap 41, and the slide ring 40 is pushed down by the cap 41 during mounting of the light engine 100e inside the bulb. The cap 41 is a hollow tube made preferably of glass and has a plastic coated tip that touches the dome of the glass bulb 75 after assembly inside the same. Tip will be touched and pushed down by the glass bulb as the light engine is raised into the bulb. The plastic for tip is preferably made of a resin like polyfluorinated ethylene of which Teflon™ is one example.

Referring to FIG. 7, the light engine 100e including the filament assembly 50a, 50b that is connected to the stem 25 is inserted into an open end of an optic 75. The cap 41 that is present atop the slide ring 40 contacts a dome portion of the optic 75, wherein as the stem 25 is brought into a seating position with the optic 75, the cap 41 presses down on the slide ring 40 pushing the side ring 40 downward on the mandrel 30. As the light engine 100e is progressively brought into the seating position with the optic 75, the cap 41 pushes down on the slide region 40, wherein the slide cap 40 that is connected to electrically conductive pathways 55a, 55b that are electrically connected to the second end of the at least two light emitting diode (LED) filaments 50a, 50 causes the LED filaments to be away from the mandrel 30 at their second end, while the first end of the at least two light emitting diode (LED) filaments 50a, 50b is substantially fixed adjacent to the mandrel 30 by connectivity to the leads 76, 77. Pushing the second end of the at least two light emitting diode (LED) filaments 50a, 50b away from the sidewall of the mandrel 30, while the first end of the at least two light emitting diode (LED) filaments 50a, 50b is substantially fixed via connection to the electrical leads 76, 66 of the stem 25 provides that the at least two LED filaments 50a, 50b are arranged in a V-shaped geometry when the stem 25 is in the seated position with the optic 75. The downward motion of cap 41 stops when an enlarged structure 43 located on mandrel is contacted by the ring 40. This prevents the cap 41 from going down further. In some embodiments, pushing the second end of the light emitting diode (LED) filaments 50a, 50b away from the sidewall of the mandrel 30 provides a taper angle α ranging from 5° to 30° for the V shaped geometry. An enhanced V shaped geometry that provides increased lower lighting has a taper angle α (also referred to as tilt angle) that exceeds 15° and may be as great as 30°. With the enhanced V shaped configuration shown in FIG. 4, increased lumen can be measured in the −130/180/+135 deg zone, which is light directed towards the floor.

In some embodiments, the glass stem 25 may then be sealed to the optic 75, which is evacuated of air via exhaust port 24 and then backfilled with a gas blend of suitably high thermal conductivity.

In summary, the sequence of assembly steps for the V shaped LE is as follows:

Automation device picks up V shaped light engine structure 100e as shown in FIG. 6.

Robot inserts this structure vertically inside the glass bulb, i.e., optic 75, through the available opening 71 of the bulb located at the bottom of the bulb.

As the V shaped light engine structure 100e enters the bulb and is moved upwards, at a certain time the plastic tip of the cap 41 will touch the inside top of the glass bulb dome.

Further upward movement of the mandrel 30 and the cap 41 results in compression of the ring 40 and spreading out of the V shape of the filaments 50a, 50b to increase the taper angle α.

The spreading of the V shape, i.e., increase in the taper angle α, continues until the ring 40 touches the mechanical stop 43 that is present on the mandrel 30.

The angle of the V is determined by the relative lengths of wires 55a, 55b and filaments 50a, 50b.

Then a standard glass drop seal process is conducted to join stem 25 with bulb 75.

The V shaped geometry for the light emitting diode (LED) filaments provides an enhanced light distribution pattern that is not possible with light engines having light emitting diode (LED) filaments arranged in an inverted V shaped geometry. For example, the new more uniform light distribution pattern provided by the light engine having the light emitting diode (LED) filaments arranged in a V shaped geometry can be especially advantageous when employed in a lamp to emit decorative light, e.g., red or blue or green light or any combination thereof. This light distribution attribute resulting from the new light engine geometry can add to the appeal of decorative lighting on occasions like birthdays, anniversaries, dance parties etc. This attribute would also be attractive for lighting on religious occasions like Halloween, Easter, Christmas, Diwali, Hanukkah, Eid al-Adha etc. The more uniform light distribution pattern provided by the light engine having the light emitting diode (LED) filaments arranged in the V shaped geometry is now described in more detail by the following data and recorded experimentation.

Light Distribution Measurements

The light distribution from a test sample light engine including a filament assembly having light emitting diode (LED) filaments arranged in a V shaped geometry was measured using a goniometer. The light engine including the filament assembly having the at least two light emitting diode (LED) filaments arranged in a V shaped geometry has been described above with reference to FIGS. 1 and 2-6. For example, the light engine includes four light emitting diode (LED) filaments that are connected in a two filaments in parallel and two filaments in series (2P2S) configuration.

The light distribution was also measured from a comparative sample having the same type and number of light emitting diode (LED) filaments but in the comparative sample the light engines employ light emitting diode (LED) filaments arranged in an inverted V shaped geometry. A goniometer measures the luminous intensity (candela) from a light source as a function of the angle.

Figure 8:
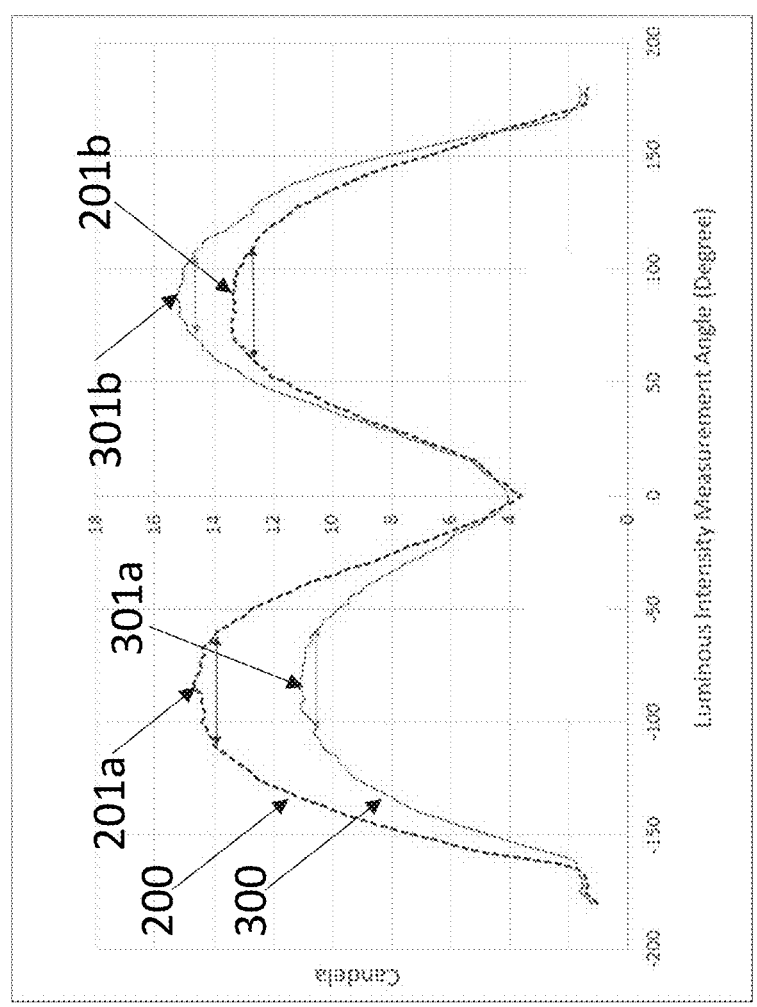
FIG. 8 is a plot illustrating the luminous intensity distribution resulting from a test sample of a light engine having light emitting diode filaments arranged in a V shaped geometry in comparison with a comparative sample of a light engine having light emitting diode filaments arranged in an inverted V shaped geometry, the inverted V shaped geometry being the current state of the art.

FIG. 8 is a plot illustrating the luminous intensity distribution measured using the goniometer that results from a test sample of a light engine having light emitting diode (LED) filaments arranged in a V shaped geometry in comparison with a comparative sample of a light engine having light emitting diode (LED) filaments arranged in an inverted V shaped geometry. The plot identified by reference number 200 is the light intensity distribution that is measured from the test sample of the light engine having the light emitting diode (LED) filaments arranged in a V shaped geometry. The plot identified by reference number 300 is the light intensity distribution that is measured from the comparative sample of the light engine having the light emitting diode (LED) filaments arranged in the inverted V shaped geometry.

FIG. 9 shows how the angles on the x-axis of FIG. 8 are defined. Angles higher than 130° or so refer to the region near the lower part of the lamp (near the base) while angles lower than 45° refer to the region closer to the top of the lamp while 90° refers to the center-plane of the lamp.

It is observed in FIG. 8 that the luminous intensity is more uniform for the V shaped light engine geometry taught by the present disclosure, e.g., as depicted in FIGS. 1 and 2-6, compared to an inverted V light engine configuration. Two local maxima were marked 201*a*, 201*b* for plot 200 between 0° and −180° and between 0° and 180° of the luminous intensity (candela) measured from the test sample for the light engine having the light emitting diode (LED) filaments arranged in the V shaped geometry. Two local maxima were also marked 301*a*, 301*b* for plot 300 between 0° and −180° and between 0° and 180° of the luminous intensity (candela) measured from the comparative sample for the light engine having the light emitting diode (LED) filaments arranged in the inverted V shaped geometry. From the maxima 201*a*, 201*b*, 301*a*, 301*b* marked on the plots identified by 200, 300, two angles are determined in each region over which the candela differs from the local maximum by 5% or less. The difference between the two angles is the angular region over which the luminous intensity is both high and almost flat or uniform. The larger this angular region, the more uniform and better the luminous intensity distribution from the light engine. Table 1 shows the comparison between the two light engines. It is seen that the V shaped light engine that provided curve 200 has about a 50+50 or about a 100° angular region of uniformity of illumination compared to about 37.5+40 or about 77.5° angular region of uniformity for the standard inverted V shaped light engine that provided curve 300.

TABLE 1

Comparison of Uniformity of Illumination

| LE Geometry | Angle 1 | Angle 2 | Flat Region | Angle 1 | Angle 2 | Flat Region |
|---|---|---|---|---|---|---|
| V Shape (Invention) | 60 | 110 | 50 | −62.5 | −112.5 | 50 |
| Inverted V (Standard) | 70 | 107.5 | 37.5 | −60 | −100 | 40 |

The V shaped light engine of the present disclosure (as described with reference to FIGS. 1 and 2-7) is, therefore, superior for the purposes of illumination than light engines having the inverted V shaped light engine and is preferred.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Spatially relative terms, such as "forward", "back", "left", "right", "clockwise", "counter clockwise", "beneath," "below," "lower," "above," "upper," and the like, can be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs.

Having described preferred embodiments of a light emitting diode filament lamp with V-geometry, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A light engine comprising:
   electrical leads extending into a supporting stem; and
   a filament assembly having a V-shaped geometry in electrical connection with the electrical leads and includes at least two light emitting diode (LED) filaments, wherein a first end of the filament assembly is in electrical contact with the electrical leads and provides an apex portion of the V-shaped geometry, and a second end of the filament assembly opposite the first end has a second width greater than the first width of the apex portion, and an electrically conductive pathway that connects the at least two light emitting diode (LED) filaments at the second end, wherein a first of the at least two light emitting diode (LED) filaments is electrically connected to an anode of the electrical leads, and a second of the at least two light emitting diode (LED) filaments is electrically connected to a cathode of the electrical leads, and a mandrel extends from the stem, the mandrel having a height substantially equal to the height of the filament assembly at the second end, wherein the electrically conductive pathway has the geometry of a ring that encircles the mandrel and connects the second end for each of the at least two light emitting diode (LED) filaments at the second end, and a linear wire like geometry support structure extends from the second end of a first of the at least two light emitting diode (LED) filaments to a second of the at least two light emitting diode (LED) filaments through the mandrel.

2. The light engine of claim 1, wherein the at least two light emitting diode (LED) filaments include a first set of light emitting diode (LED) filaments connected in parallel to the anode of the electrical leads on a first side of a mandrel extending from the stem at the first end of the filament assembly, and a second set of light emitting diode (LED) filaments connected in parallel to the cathode of the electrical leads on a second side of the mandrel extending from the stem at the first end of the filament assembly, the first and second set of light emitting diode (LED) filaments connected in series at the second end of the filament assembly by the electrically conductive pathway.

3. A lamp comprising:
   a housing including a light projecting end and a base having an electrical connector for connection with a lamp fixture;
   a light engine including light emitting diodes (LEDs) positioned at the light projecting end of the housing, the light engine comprising a filament assembly including at least two light emitting diode (LED) filaments having a V-shaped geometry that are connected at a first end of the filament assembly to electrical leads extending into a supporting stem that is connected to the base of the housing, the first end of the filament assembly providing an apex portion of the V-shaped geometry, and a second end of the filament assembly opposite the first end having a second width greater than the first width of the apex portion, wherein an electrically conductive pathway connects the first and second of the at least two light emitting diode (LED) filaments at the second end, wherein a mandrel extends from the stem, the mandrel having a height substantially equal to the height of the filament assembly at the second end and the electrically conductive pathway includes a linear wire like geometry that extends from the second end of a first of the at least two light emitting diode (LED) filaments to a second of the at least two light emitting diode (LED) filaments through the mandrel; and a driver assembly present in the housing may be in electrical communication with an electrical connector of the base of the housing and the electrical leads to the light engine.

4. The lamp of claim 3, wherein a first of the at least two light emitting diode (LED) filaments is electrically connected to an anode of the electrical leads, and a second of the at least two light emitting diode (LED) filaments is electrically connected to a cathode of the electrical leads.

5. The lamp of claim 4, wherein the electrically conductive pathway has the geometry of a ring that encircles the mandrel and connects the second end for each of the at least two light emitting diode (LED) filaments at the second end.

6. The lamp of claim 3, wherein the at least two light emitting diode (LED) filaments include a first set of light emitting diode (LED) filaments connected in parallel to the anode of the electrical leads on a first side of a mandrel extending from the stem at the first end of the filament assembly, and a second set of light emitting diode (LED) filaments connected in parallel to the cathode of the electrical leads on a second side of the mandrel extending from the stem at the first end of the filament assembly, the first and second set of light emitting diode (LED) filaments connected in series at the second end of the filament assembly by the electrically conductive pathway.

7. A method of assembling a lamp comprising:

connecting a filament assembly to a supporting stem of a lamp, the stem including a mandrel and electrical leads extending from the stem on opposing sides of the mandrel, the filament assembly including at least two light emitting diode filaments each including a connecting electrically conductive pathway from a second end from each of the at least two light emitting diode filaments to a slide ring, wherein said connecting the filament assembly to the supporting stem includes electrically connecting a first end for the at least two light emitting diode (LED) filaments to the electrical leads of the stem, wherein the mandrel is positioned within an opening of the slide ring;

positioning a cap on the mandrel atop the slide ring; and inserting the filament assembly connected to the stem into an open end of an optic, the cap that is present atop the slide ring contacting a dome portion of the optic, wherein as the stem is brought into a seating position with the optic the contact presses down on the slide ring pushing the slide ring downward on the mandrel, and pushing the connecting electrically conductive pathways that are electrically connected to the second end of the at least two light emitting diode (LED) filaments away from the mandrel while the first end of the at least two light emitting diode (LED) filaments is substantially fixed adjacent to the mandrel to provide that the at least two light emitting diode (LED) filaments are arranged in a V-shaped geometry when the stem is in the seated position with the optic.

8. The method of claim 7, wherein a second width of separation at the second end of the at least two light emitting diode (LED) filaments is greater than a first width of separation at the first end of the at least two light emitting diode (LED) filaments.

9. The method of claim 8, wherein a first of the at least two light emitting diode (LED) filaments is electrically connected to an anode of the electrical leads, and a second of the at least two light emitting diode (LED) filaments is electrically connected to a cathode of the electrical leads.

10. The method of claim 8, wherein the at least two light emitting diode (LED) filaments include a first set of light emitting diode (LED) filaments connected in parallel to the anode of the electrical leads on a first side of a mandrel extending from the stem at the first end of the filament assembly, and a second set of light emitting diode (LED) filaments connected in parallel to the cathode of the electrical leads on a second side of the mandrel extending from the stem at the first end of the filament assembly, the first and second set of light emitting diode (LED) filaments connected in series at the second end of the filament assembly by the electrically conductive pathway.

11. The method of claim 8, wherein the electrically conductive pathway includes a linear wire composed of a metal.

12. The method of claim 8, wherein the slide ring is composed of an electrically conducive material.

13. The light engine of claim 1, wherein the first end of the filament assembly having the V-shaped geometry is closer to the supporting stem than the second end of the filament assembly.

* * * * *